United States Patent [19]

Okazaki

[11] Patent Number: 5,753,539
[45] Date of Patent: May 19, 1998

[54] METHOD OF MAKING AN INTEGRATED CIRCUIT WITH WINDOWED FUSE ELEMENT AND CONTACT PAD

[75] Inventor: Motoya Okazaki, Fishkill, N.Y.

[73] Assignee: Kabushiki Kaisha Toshiba, Kawasaki, Japan

[21] Appl. No.: 658,571

[22] Filed: Jun. 5, 1996

Related U.S. Application Data

[62] Division of Ser. No. 335,387, Nov. 3, 1994, Pat. No. 5,550,399.
[51] Int. Cl.⁶ .................................................. H01L 21/82
[52] U.S. Cl. .......................... 438/132; 438/638; 438/700; 438/735
[58] Field of Search ................................... 438/132, 638, 438/735, 700

[56] References Cited

U.S. PATENT DOCUMENTS

| | | |
|---|---|---|
| 3,844,858 | 10/1974 | Bean . |
| 3,878,552 | 4/1975 | Rodgers . |
| 3,969,749 | 7/1976 | Bean . |
| 4,219,835 | 8/1980 | van Loon et al. . |
| 4,255,207 | 3/1981 | Nicolay et al. . |
| 4,269,636 | 5/1981 | Rivoli et al. . |
| 4,536,949 | 8/1985 | Takayama et al. . |
| 4,628,590 | 12/1986 | Udo et al. . |
| 4,717,681 | 1/1988 | Curran . |
| 5,201,987 | 4/1993 | Hawkins et al. . |
| 5,360,988 | 11/1994 | Uda et al. . |
| 5,444,012 | 8/1995 | Yoshizumi . |

FOREIGN PATENT DOCUMENTS 1319956  12/1989  Japan .

*Primary Examiner*—Tuan H. Nguyen
*Attorney, Agent, or Firm*—Banner & Witcoff, Ltd.

[57] ABSTRACT

A permanently alterable, i.e., customizable, integrated circuit has a fuse element and contact pad, and windows extending above the same through an insulative layer. The contact pad window extends down to and exposes the contact pad. The fuse element window terminates just short of the fuse element so that the fuse element remains covered by a thin layer of insulative material. The fuse element and the contact pad reside in a common plane of the substrate and thus can be formed together using a single photolithographic transfer step. Windows of different depth are created above the fuse element and contact pad in a single etching step by providing at least one narrow width etching pattern resist aperture above the fuse element. This slows the etch rate at the fused element relative to that at the contact pad, due to a microloading effect.

22 Claims, 1 Drawing Sheet

METHOD OF MAKING AN INTEGRATED CIRCUIT WITH WINDOWED FUSE ELEMENT AND CONTACT PAD

This application is a division of application Ser. No. 08/335,387, filed Nov. 3, 1994 now U.S. Pat. No. 5,550,399.

BACKGROUND OF THE INVENTION

The present invention relates to the production of semiconductor integrated circuits, particularly circuits including windows exposing contact pads and fused elements that can be selectively blown to achieve different circuit functions and capabilities.

It is known to incorporate fuse elements into semiconductor integrated circuits to enable permanent alteration of a basic circuit design, i.e., to produce the so-called application specific integrated circuits (ASIC's). See, e.g., Takayama et al. U.S. Pat. No. 4,536,949. When left undisturbed, the fuse elements provide conductor paths between certain circuit devices. The fuses may also serve as resistive elements. The fuses can be blown to destroy selected paths of conductivity, whereby a circuit function can be permanently altered, i.e. customized. Typically, the fuse elements are burned off (blown) by impinging on the fuse a high energy laser beam, or by application of an electrical current to the fuse element. A high degree of production efficiency is achieved with fused integrated circuits since a range of functions and capabilities can be achieved with a single basic circuit design. Moreover, defective redundant cells, e.g., in a DRAM chip, can be isolated using selectively placed fuse elements.

When a fuse element is embedded underneath an insulative chip layer, it is necessary to provide a window above the fuse element in order to allow for the escape of hot gases when the fuse is blown. Otherwise, the hot gases and pressures generated thereby could cause thermal and mechanical damage to the surrounding chip structure. Additionally, when a laser is used to blow the fuse, a window is necessary to allow the laser beam to impinge on the fuse element.

Recently it has been recognized that it is desirable to form the window above the fuse element such that a thin layer of insulative material remains over the fuse element. The thin layer protects the fuse element from corrosion, and also improves the efficiency of the fuse blow through the generation and retention of additional heat therein. Referring to FIG. 3, the conventional technique for forming such a window has been to place the fuse elements 1 (only one shown) on a chip layer 3 positioned below a primary conducting path including one or more contact pads 5. By placing the fuse element 1 at a position below contact pad 5, a window 7 can be formed above the fuse element 1 in the same etching step used to form a window 9 above contact pad 5. Apertures formed by a resist pattern 10 are used to form windows 7 and 9 during the etching step. These apertures (which correspond in size to the windows formed thereby) have widths just slightly smaller than the respective fuse element and contact pads. For example, the fuse windows may have a width of 10 μm. The contact pad windows 9 may have a width of 80 μm. Due to the relatively small window size differential, the etch rate at each window does not differ significantly. Since the insulative layer 11 is etched at substantially the same rate above both the fuse 1 and the contact pad 5, exposure to the etchant just long enough to create a window 9 exposing the contact pad 5 will also create a window 7 of the same depth above fuse element 1. Since the fuse element 1 is positioned slightly lower than the contact pad, a thin layer of insulative material 13 will remain between the contact pad and the window thereabove, as desired. Unfortunately, this conventional procedure requires two separate photolithographic transfer processes: one for producing the primary circuit paths, including the contact pads; and another for producing the fuse elements. Separate chip layers and conductor materials are also required. This results in increased fabrication time, effort and expense.

Accordingly, it would be desirable to avoid the requirement of two photolithographic processes, layers and conductor materials in the production of a fused integrated circuit, as described above.

SUMMARY OF THE INVENTION

In view of the foregoing, it is a principal object of the invention to provide an improved method of producing an integrated circuit which is readily permanently alterable in order to achieve different circuit functions and capabilities.

It is a more specific object of the invention to provide a technique for retaining a thin layer of insulative material between a fuse window and a fuse element of the integrated circuit, thereby avoiding the requirement of separate photolithographic transfer processes, layers and conductor materials for formation of the contact pads and fuse elements.

It is another object of the invention to provide an intermediate integrated circuit product useful in the aforementioned fabrication technique, and a resultant permanently alterable integrated circuit.

In one aspect, the invention resides in a method of making an integrated circuit including a fuse element and a contact pad. A circuit path including a fuse element and a contact pad is formed on a substrate. The circuit is at least partially covered with an insulative layer. A patterned resist layer is formed on the insulative layer. The resist layer provides a first aperture above the fuse element and a second aperture above the contact pad. The first aperture is made with a width dimension which is sufficiently small to decrease an etch rate of the insulative layer at the first aperture, relative to the second aperture. The insulative layer is etched at the first and second apertures, at different rates dictated by the relatively small width of the first aperture, to form first and second windows of different depths above the fuse element and contact pad, respectively. The first window terminates short of the fuse element such that a thin layer of insulative material remains between the fuse element and the first window. The second window extends down to the contact pad to expose the contact pad.

In a second aspect, the invention resides in an intermediate product used in the production of an integrated circuit including a fuse element and a contact pad. The product comprises a substrate and a circuit path formed on the substrate. The circuit path includes a fuse element and a contact pad. An insulative layer at least partially covers the circuit path. A patterned resist layer is provided on the insulative layer. The resist layer provides a first aperture above the fuse element and a second aperture above the contact pad. The first aperture is made with a width dimension which is sufficiently small decrease an etch rate of the insulative layer at the first aperture, relative to the second aperture.

In a third aspect, the invention resides in a permanently alterable integrated circuit. The circuit comprises a substrate and a circuit path formed on the substrate. The circuit path includes a fuse element and a contact pad lying in a common plane. An insulative layer at least partially covers the circuit path. First and second windows are formed in the insulative layer above the fuse element and contact pad, respectively. The first window has a depth terminating short of the fuse element such that a thin layer of insulative material remains between the fuse element and said first window. The second window extends down to the contact pad to expose the contact pad.

These and other objects, features and advantages of the invention will be readily apparent and fully understood from the following detailed description, taken in connection with the appended drawings.

DETAILED DESCRIPTION OF THE PREFERRED EMBODIMENTS

Figure 1:
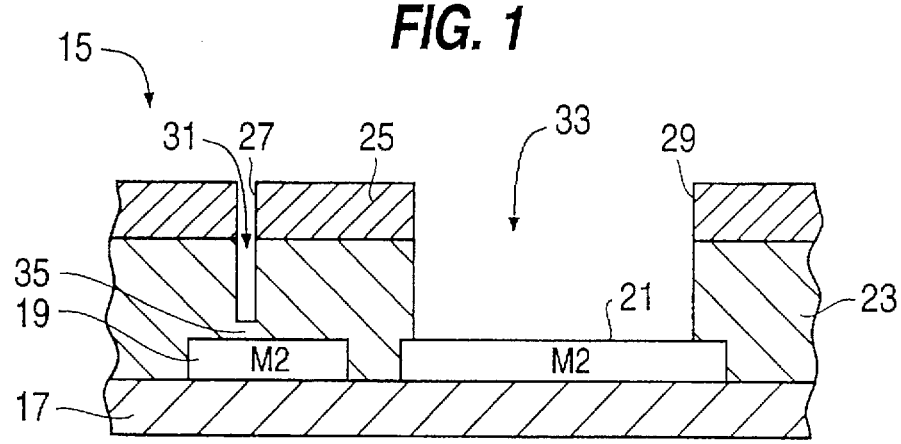
FIG. 1 is a partial cross-sectional view of an integrated circuit in accordance with the present invention, including a windowed fuse element and contact pad.

Referring first to FIG. 1, a semiconductor integrated circuit 15 comprises a silicon substrate 17. Although not shown, incorporated into substrate 17 are various doped regions (and possibly multiple layers) forming a variety of circuit devices. Affixed on a common top plane of substrate 17 are a fuse element 19 and a contact pad 21. (Typically, a large number of fuse elements and contact pads are provided.) These elements constitute part of a complete circuit conduction path connecting the various semiconductor devices. Suitable materials for the circuit path (including fuse element 19 and contact pad 21) include but are not limited to Al, AlCu, AlCuSi, Ti, TiN, W, WSi, and TiSi. Covering the circuit path is an insulative layer 23 of $SiO_2$, or $Si_3N_4$. Although it will depend on the particular product, the insulative layer generally will have a thickness in the range of 6000 A to 10,000 A. On top of insulative layer 23 is a pattern of resist material 25, e.g., APEX-E, forming a narrow slit-like aperture 27 above fuse element 19, and a much wider aperture 29 above contact pad 21.

Resist pattern 25 is used during an etching step to form windows 31, 33 above fuse element 19 and contact pad 21, respectively. Windows 31, 33 correspond in size to apertures 27 and 29. After the etching step, resist layer 25 can be removed. While the size of aperture 29 is not critical and can be matched to the size of the pad (typically 20 µm or greater), the width of aperture 27 should be on the order of 1 µm or smaller. In a preferred embodiment, the width of aperture 27 is approximately 0.5 µm, while the width of aperture 29 is approximately 100 µm. A width of aperture 27 of 1 µm or less advantageously causes the etch rate above the fuse to be slowed relative to the etch rate above contact pad 21, due to a generally known microloading effect. Thus, by etching at apertures 27 and 29 in the same process step, i.e., exposing insulative layer 23 to the same etchant (e.g., a reactive ion etchant) for the same amount of time, windows of different depth result. Window 33 extends down to and exposes contact pad 21. Window 31, on the other hand, terminates short of fuse element 19 such that a thin layer 35 of insulative material 23 remains between fuse element 19 and window 31.

Preferably, the process is adjusted such that the remaining thin layer 35 has a thickness of 1000 A to 3000 A. In this respect, the microloading effect can be increased by increasing the etching pressure from the normal 40–100 MTorr range to a range of several hundred (e.g., 300) MTorr. Additionally, the microloading effect can be increased by adding $CHF_3$ to the conventional etchant gas mixture of $CF_4+O_2$.

The shape of aperture 27 is not critical. However, a width dimension thereof must be small enough to cause the desired microloading effect, as described above. Also, aperture 27 should be sized to form a corresponding window 31 which affords sufficient exposure of fuse element 19 to allow it to be blown by impinging a laser beam thereon.

Figure 3:
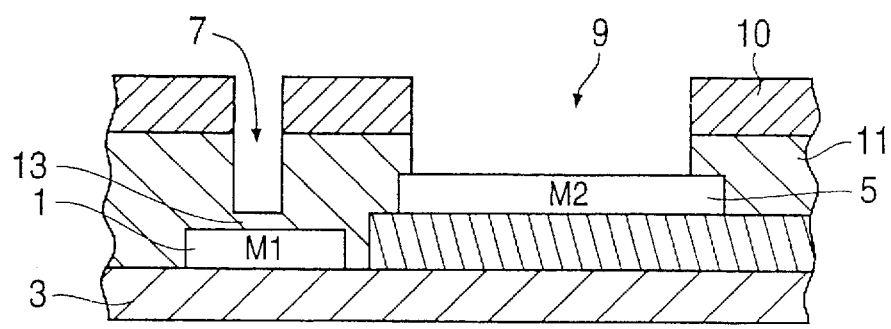
FIG. 3 is a partial cross-sectional view of a prior art integrated circuit configuration including a windowed fuse element and contact pad.

Unlike the conventional technique and product illustrated in FIG. 3, in the present invention fuse element 19 and contact pad 21 are formed at the same depth below the top surface of insulative layer 23, on a common plane of substrate 17. This allows fuse element 19 and contact pad 21 to be formed using a single metal material (or other suitable conductor) applied in a single photolithographic transfer step. Additionally, it is unnecessary to provide an extra chip layer in order to place the fuse elements and contact pads at different levels. Accordingly, substantial gains in production efficiency are realized.

Figure 2:
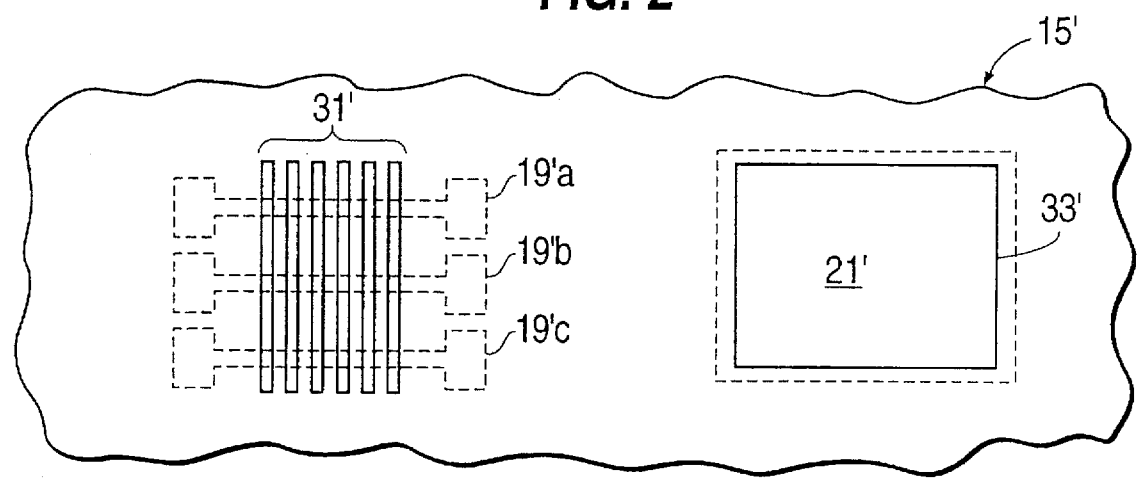
FIG. 2 is a partial plan view of an integrated circuit having a multiple fuse element and window arrangement in accordance with the present invention, and an adjacent windowed contact pad.

Referring now to FIG. 2, illustrated is a modified embodiment of the invention. As in the first embodiment shown in FIG. 1, an integrated circuit 15' has a contact pad 21' and a window 33' exposing most of contact pad 21'. The modification lies in the provision of a plurality of adjacent parallel narrow slit-like windows 31' extending transversely across a plurality of adjacent parallel fuse elements 19'a–c.

The plural fuses and windows are formed using the technique previously described. The resist pattern is of course formed with a plurality of narrow slits corresponding in size to the windows 31'. As in the first embodiment, the narrow width of the apertures (typically 1 µm or less) decreases the etch rate above the fuse elements 19'a–c relative to the etch rate above contact pad 21'. As a result, by exposing the insulative material to an etch for a sufficient amount of time to form window 33' extending down to and exposing pad 21', windows 31' will be formed less deep, terminating above the fuse elements and leaving a thin layer of insulative material to cover the fuse elements.

In a further variation, a two-dimensional array of closely spaced small apertures, e.g., circular apertures, may be substituted for slit-like windows 31'. Of course, a width dimension of each aperture should be maintained small enough to cause the desired microloading effect, as previously described.

By providing a number of windows, the exposure of the fuse element(s) is increased, whereby greater laser power can be impinged on the fuse elements to selectively burn them off and thereby customize the circuit. There obviously need not be a plurality of fuse elements to employ plural windows. For example, plural windows in the form of a one-dimensional array of small apertures aligned with a single fuse element could be used to increase the exposure of the fuse element.

The invention has been described in terms of preferred embodiments thereof. Other embodiments and variations within the scope and spirit of the appended claims will occur to those of ordinary skill in the art upon reading this disclosure.

I claim:

1. A method of making an integrated circuit including a fuse element and a contact pad, said method comprising the steps of:

forming a circuit path on a substrate, said circuit path including a fuse element and a contact pad;

covering at least part of the circuit path with an insulative layer;

forming a patterned resist layer on said insulative layer, said resist layer providing a first aperture above said fuse element and a second aperture above said contact pad, said first aperture having a width dimension which is sufficiently small to decrease an etch rate of the insulative layer at said first aperture, relative to the second aperture; and etching said insulative layer at said first and second apertures, at different rates dictated by the relatively small width of the first aperture, to form first and second windows of different depths above said fuse element and contact pad, respectively, said first window terminating short of said fuse element such that a thin layer of insulative material remains between said fuse element and the first window, said second window extending down to said contact pad to expose the contact pad;

wherein said fuse element and contact pad are formed at the same depth below a top surface of the insulative layer.

2. A method according to claim 1, wherein said fuse element and contact pad are formed in a common plane of said substrate.

3. A method according to claim 1, wherein said fuse element and contact pad are formed of the same metal material.

4. A method according to claim 1, wherein said fuse element and contact pad are formed using a single photolithographic transfer process.

5. A method according to claim 1, wherein said first and second windows are formed by applying the same chemical etchant to the insulative layer at the first and second apertures in a single application step, and allowing the etchant to act on the insulative layer at each location for the same time period.

6. A method according to claim 5, wherein said chemical etchant is a reactive ion etchant.

7. A method according to claim 1, wherein said patterned resist layer is formed with an array of apertures extending along the fuse element, and during the etching step a plurality of said first windows are formed as a corresponding array of windows terminating above the fuse element.

8. A method according to claim 7, wherein said circuit pattern is formed with a plurality of adjacent parallel fuse elements, and said array of apertures and the corresponding windows comprises a plurality of narrow slits extending transversely across the plurality of fuse elements.

9. A method according to claim 1, wherein the first window is formed with a width of 1 μm or less.

10. A method according to claim 9, wherein said first window has a width of approximately 0.5 μm and said second window has a width of at least 20 μm.

11. A method according to claim 1, wherein said insulating layer is one of $SiO_2$ and $Si_3N_4$.

12. A method of making an integrated circuit including a fuse element and a contact pad, said method comprising the steps of:

forming a circuit path on a substrate, said circuit path including a fuse element and a contact pad;

covering at least part of the circuit path with an insulative layer;

forming a patterned resist layer on said insulative layer, said resist layer providing a first aperture above said fuse element and a second aperture above said contact pad, said first aperture having a width dimension which is sufficiently small to decrease an etch rate of the insulative layer at said first aperture, relative to the second aperture; and etching said insulative layer at said first and second apertures, at different rates dictated by the relatively small width of the first aperture, to form first and second windows of different depths above said fuse element and contact pad, respectively, said first window terminating short of said fuse element such that a thin layer of insulative material remains between said fuse element and the first window, said second window extending down to said contact pad to expose the contact pad;

wherein the first window is formed with a width of 1 μm or less.

13. A method according to claim 12, wherein said fuse element and contact pad are formed at the same depth below a top surface of the insulative layer.

14. A method according to claim 13, wherein said fuse element and contact pad are formed in a common plane of said substrate.

15. A method according to claim 12, wherein said fuse element and contact pad are formed of the same metal material.

16. A method according to claim 12, wherein said fuse element and contact pad are formed using a single photolithographic transfer process.

17. A method according to claim 12, wherein said first and second windows are formed by applying the same chemical etchant to the insulative layer at the first and second apertures in a single application step, and allowing the etchant to act on the insulative layer at each location for the same time period.

18. A method according to claim 17, wherein said chemical etchant is a reactive ion etchant.

19. A method according to claim 12, wherein said patterned resist layer is formed with an array of apertures extending along the fuse element, and during the etching step a plurality of said first windows are formed as a corresponding array of windows terminating above the fuse element.

20. A method according to claim 19, wherein said circuit pattern is formed with a plurality of adjacent parallel fuse elements, and said array of apertures and the corresponding windows comprises a plurality of narrow slits extending transversely across the plurality of fuse elements.

21. A method according to claim 12, wherein said first window has a width of approximately 0.5 μm and said second window has a width of at least 20 μm.

22. A method according to claim 12, wherein said insulating layer is one of $SiO_2$ and $Si_3N_4$.

* * * * *